United States Patent [19]

Powers, Jr.

[11] 4,434,541

[45] Mar. 6, 1984

[54] ELECTROMAGNETIC SHIELDING

[75] Inventor: Donald H. Powers, Jr., Needham, Mass.

[73] Assignee: Chomerics, Inc., Woburn, Mass.

[21] Appl. No.: 219,069

[22] Filed: Dec. 22, 1980

[51] Int. Cl.³ .................. B23P 19/00; H01P 1/00; H01P 11/00

[52] U.S. Cl. .................. 29/526 R; 29/600; 428/570

[58] Field of Search .............. 29/600, 875, 526 R, 29/875; 428/570

[56] References Cited

U.S. PATENT DOCUMENTS

| | | | |
|---|---|---|---|
| 3,140,342 | 7/1964 | Ehrreich et al. | 29/875 |
| 3,194,860 | 7/1965 | Ehrreich et al. | 264/154 |
| 3,202,488 | 8/1965 | Ehrreich et al. | 428/570 |
| 3,476,530 | 11/1969 | Ehrreich et al. | 29/192 |
| 3,583,930 | 6/1971 | Ehrreich et al. | 252/574 |

*Primary Examiner*—Howard N. Goldberg
*Assistant Examiner*—V. K. Rising
*Attorney, Agent, or Firm*—Sewall P. Bronstein; Donald Brown

[57] ABSTRACT

Electromagnetic energy shielding material in forms such as form stable gaskets, caulking compounds, coatings, adhesives, etc., the material being composed of a plastic binder and electrically conductive particles having an aluminum core, a first metallic layer thereover e.g., of tin and a silver outer layer.

10 Claims, 6 Drawing Figures

CONDUCTIVE PLASTIC

ELECTROMAGNETIC SHIELDING

BACKGROUND OF THE INVENTION

The present invention is directed to electromagnetic interference (EMI) shielding and is more particularly directed to new materials, e.g., gaskets, caulking compounds, adhesives, coatings, etc., useful for EMI shielding.

Today EMI shielding takes many forms depending upon the application. Where high shielding performance is necessary, EMI shielding has tended to use silver particles or silver coated copper particles dispersed in a resin binder. The EMI shielding product has been formed into gaskets of various shapes, sheets or provided as caulking compounds, adhesives, coatings, etc.

While it is still preferred from a technical standpoint that pure silver particles based EMI shielding materials be used, the cost of silver has made this economically impracticable for most applications.

The use of silver coated copper which has usually been a substitute for silver particles has certain disadvantages, particularly with respect to ageing characteristics. The maximum continuous temperature for silicone rubber gaskets filled with silver coated copper particles is generally considered to be about 125° C. At higher temperatures, oxidation of the exposed copper tends to result in loss of electrical conductivity. In addition, on exposure to salt spray, corrosion products formed on exposed copper are green colored. In general, salt spray corrosion does not severely affect either electrical or physical properties, but the green corrosion products are unsightly.

The art is also replete with the use of other types of electrically conductive particles in EMI shielding materials. One of those in substantial use at this time is silver coated glass.

EMI shielding gaskets employing current state of the art silver coated glass particles have under certain vibration conditions experienced increased resistance and thus became substantially ineffective as a shield.

In addition, silver coated glass particles because they are not an all metallic material do not have high current carrying capacity which is necessary if an electromagnetic pulse condition is encountered.

Reference may be had to U.S. Pat. Nos. 3,140,342, 3,194,860, 3,202,488, 3,476,530 and 3,583,930 for a description of the state of the art.

The present invention provides an EMI shield which avoids some of the cost and other disadvantages of silver coated particle EMI compositions (materials) of the prior art while at the same time providing almost the same EMI shielding effectiveness as EMI shielding compositions using solid silver particles. Unexpectedly it has been discovered in this invention that it is possible to use silver coated particles using about one third less silver than used on silver coated copper particles and yet achieve about as good conductivity as that obtained when using silver coated copper particles as the electrically conductive particle. In addition, the maximum continuous use temperature has been found to be about 200° C. using a silicone binder.

The present invention also has the advantages in comparison with silver coated copper in that the characteristic green corrosion is no longer a factor.

The weight of the EMI shield has also been significantly reduced in this invention in comparison to silver or silver coated copper based EMI shielding systems, a significant factor for aerospace applications.

BRIEF SUMMARY OF THE DISCLOSURE

An EMI shielding material (composition) having a volume resistivity to be effective as an electromagnetic shield. The material comprises a resin matrix loaded (filled) with electrically conductive solid metal particles having at least three separate layers of metal, the innermost layer or core being aluminum, the first layer on said core being most preferably tin, less preferably zinc, and least preferably nickel and the outer layer being silver.

The material preferably has a volume resistivity less than 0.01 ohm cm, and most preferably less than 0.004 ohm cm. The material is preferably loaded with particles so that it contains 20 to 50 volume percent, more preferably 30 to 42 volume percent and most preferably 35–38 volume percent.

The particles preferably comprise by weight 1 to 10% and most preferably 3 to 8%, (most preferably tin, less preferably zinc, or least preferably nickel), 10 to 25% by weight of silver and the remainder by weight of aluminum. The particles have the ability to withstand 200° C. for 120 hours without exhibiting substantial loss of conductivity. The particles are preferably 1 to 60 microns in average particle size and most preferably about 15 to 30 microns in average to particle size.

The particles are preferably irregular in shape. The silver outer surface of the particle preferably is comprised of large numbers of contiguous silver nodules firmly adhered to the underlying particle coated core e.g., aluminum coated with tin.

The term "irregular in shape" is meant to include all shapes of irregular particles including substantially spherical particles, however it is not meant to include flat platelets.

The term "resin" as used herein denotes a plastic material, and plastic as used herein is intended to include rubbers such as silicone, flurosilicone and polyisobutylene rubbers. Other plastics usable herein include polyamides, acrylics, urethanes, polyvinyl chloride, silicone, and others conventionally used in gaskets, adhesives, caulking compounds and coatings.

DETAILED DESCRIPTION OF THE DISCLOSURE

Figure 1:
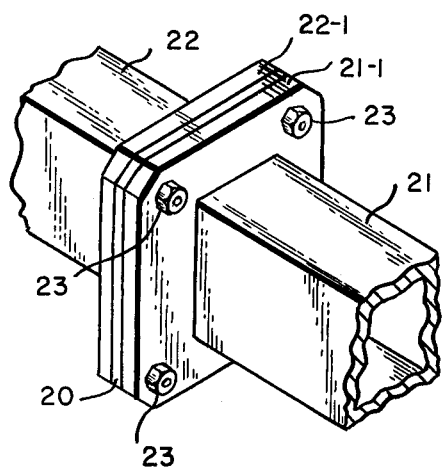
FIG. 1 is an isometric view of a compressible gasket according to this invention between two wave guide flanges.
Figure 2:
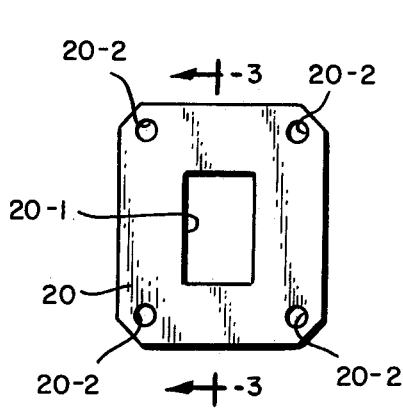
FIG. 2 is a front view of the gasket.
Figure 3:
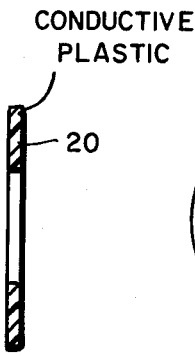
FIG. 3 is a sectional view of FIG. 2 taken along line 3—3.

Reference should now be had to FIGS. 1 to 3. In these FIGS. a die-cut form stable gasket 20 is placed between the flanges 21-1 and 22-1 of wave-guides 21 and 22 which are held together by bolts 23. The gasket 20 being of a compressible binder effectively seals the junction against moisture entering the wave-guides as well as preventing electromagnetic energy in the waveguide from escaping. While the gasket may be cut from a sheet of material it should be appreciated that it may also be molded. The gasket 20 has a central opening for the electromagnetic energy to pass from one waveguide section to another and holes 20-2 for passage of bolts 23.

Figure 4:
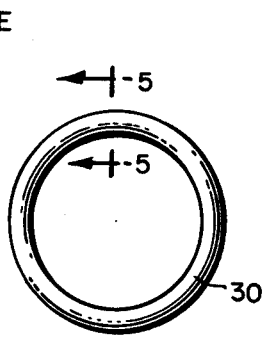
FIG. 4 is a front view of an O ring gasket.
Figure 5:
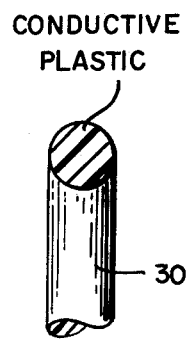
FIG. 5 is a sectional view of FIG. 4 taken along line 5—5.

In FIGS. 4 and 5 there is disclosed a molded O ring 30 as an electromagnetic energy shield. The O ring 30 is placed in grooves of two members and pressure is applied to compress the O ring to achieve an effective seal.

Figure 6:
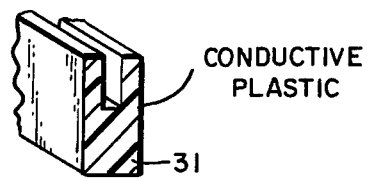
FIG. 6 is a sectional view of an extruded channel strip gasket.

FIG. 6 illustrates an extruded channel strip gasket 31 made of the shielding material disclosed herein.

It is clear from the above that gaskets (die-cut, extruded, molded) of many shapes can be made using the material of this disclosure and accordingly the invention herein should not be considered as limited to any particular shape.

In this invention, the most preferred material comprises a silicone rubber binder filled with electrically conductive irregularly shaped particles of an aluminum core having a first coating of tin which has applied to it a coating of silver.

Other binders (resin matrix) may include fluorosilicone rubber and others mentioned in the brief summary of the disclosure. The material may be formed as sheets, molded articles, coatings, adhesives, etc., depending upon the nature of the binder used.

It should also be appreciated that fillers such as silica may be added to assist in the mechanical properties of the material if desired.

In place of the preferred particle, particles comprised of an aluminum core coated with zinc or nickel which is then coated with silver may be used although at this time they are less preferred.

The material preferably comprises 80 to 50 volume percent of resin matrix (binder) and 20 to 50 volume percent of electrically conductive particles as described above.

The volume resistivity of the material is preferably less than 0.01 ohm cm and is most preferably less than 0.005 ohm cm. The particles preferably comprise by weight 3 to 6% of tin, zinc or nickel, 10 to 25% by weight of silver and the remainder by weight of aluminum.

The particles are preferably 1 to 60 microns in average particle size and most preferably about 20 to 30 microns in average particle size. The electrically conductive particles (powders) useful in this invention may be made by various methods.

Aluminum surfaces e.g., Alcoa Atomized Powder No. 101 (−100 mesh) may be coated with zinc by using a zincate treatment in which zinc oxide is dissolved in sodium hydroxide. Under these strongly alkaline conditions the oxide layer on the aluminum surface is loosened and zinc is plated on the surface in a displacement reaction. Standard formulae for treatment of bulk aluminum parts may be found in the 1978 Metal Finishing Guidebook Directory, 46th Annual Edition, pp 171-172, published by Metals and Plastics Publications, Inc. Hackensack, N.J., as follows:

| (1) | Sodium Hydroxide | 70 oz/gal | 524 g/l |
|---|---|---|---|
|  | Zinc Oxide | 13 oz/gal | 97 g/l |
| (2) | Sodium Hydroxide | 6.7 oz/gal | 50 g/l |
|  | Zinc Oxide | 0.67 oz/gal | 5 g/l |
| (3) | Sodium Hydroxide | 16 oz/gal | 120 g/l |
|  | Zinc Oxide | 2.7 oz/gal | 20 g/l |

Using aluminum powder, the amount of sodium hydroxide present should be controlled since its reaction with aluminum powder is violent and exothermic. In order to keep the reaction under control with relatively fine aluminum powders (ca 20 micron average particle size) one should preferably use a solution containing approximately 10 grams of sodium hydroxide and 1.5 grams of zinc oxide with 100 grams of aluminum powder (Alcoa Atomized Powder No. 101) in about 750 mil deionized water. Best results were obtained when the reaction mixture is stirred for one hour. The powder was allowed to settle and is rinsed five times. The sodium hydroxide-zinc oxide treatment is then repeated and the powder rinsed five times. It has been found that a second zincate treatment is preferred with powder to achieve optimum properties after silver plating.

In order to sensitize the powder for silver plating, the zinc coated aluminum powder is immersed in a dilute solution of a reducing agent. In theory, the reducing agent is adsorbed on the powder surface and initiates silver plating at the adsorption sites. In practice a 100 gram sample of zincated powder is dispersed in approximately 750 ml of deionized water containing 100 ml of 37% formaldehyde and stirred fifteen minutes. The powder is allowed to settle and is rinsed three or four times.

Silver plating is carried out by conventional methods. The sensitized powder is dispersed in a solution prepared by dissolving 30 grams of silver nitrate in 500 ml deionized water and adding approximately 50 ml of 28% ammonium hydroxide. To this dispersion, approximately 150 ml of 37% formaldehyde is added over 15 minutes. The silver plated powder, which is a light tan color, is washed several times with water and then washed with acetone and oven dried. After the powder is dry, it is heat treated at 400° F. for three hours prior to use. Aluminum powder coated with zinc and then silver plated in this manner is highly conductive.

Another metal which may be used to form a composite particle with aluminum and silver is nickel. The aluminum powder is immersion coated with nickel from an acid solution preferably containing chloride or fluoride ions which aid in removal of the oxide coating from the aluminum. The aforementioned 1978 Metal Finishing Guidebook and Directory (p.484) describes an immersion process for deposition of nickel on aluminum using 11 grams per liter of nickel sulfate and 30 grams per liter of ammonium chloride used at the boil. It was found that doubling the nickel concentration gave improved silver plating characteristics to the aluminum powder. Thus, in a typical experiment, 100 g of aluminum powder was dispersed in 750 ml of deionized water containing 20 grams of nickel sulfate and 30 grams of ammonium chloride. The dispersion was heated to about 95° C. and stirred for one hour. The powder was allowed to settle and rinsed five times.

Sensitization for silver plating was carried out using methods conventional for nonconductors. First, the powder was dispersed in a solution containing 1 gram per liter stannous chloride and 4 grams per liter of 36% hydrochloric acid.

After five rinses, the powder was dispersed in a solution containing 0.2 g/l palladium chloride and 0.2 g/l 36% hydrochloric acid. After stirring fifteen minutes, the powder is allowed to settle and rinsed five times.

Plating is carried out by dispersing the powder in a solution prepared by dissolving 30 grams of silver nitrate in 500 ml deionized water and adding approximately 50 ml of 28% ammonium hydroxide. To this dispersion about 150 ml of 37% formaldehyde is added over 15 minutes. The powder is washed several times with water, rinsed with acetone and dried. The dry powder is heat treated for three hours at 400° F.

Tin can be displacement plated on aluminum powder e.g., Alcoa Atomized Powder No 101 using alkaline solutions of tin compounds. The aforementioned 1978 Metal Finishing Guidebook and Directory, page 484 discloses 6 oz/gal (45 g/l) sodium stannate at 125°–180° F. for plating tin on aluminum. With aluminum powder lower concentrations of sodium stannate and lower temperatures should be used because of the extreme exothermic reaction. In practice 100 g of aluminum powder is dispersed in 700 ml of water and a solution of 13 grams of sodium stannate is added over 30 minutes.

The mixture is stirred for one hour and allowed to settle and is rinsed five times. The stannate treatment is repeated and the powder is dried. Sensitizing and silver plating are carried out as with zinc.

It should be understood that other known methods may also be used to effect plating of aluminum.

Reference may be had to the following for examples of the invention.

EXAMPLE I

A highly electrically conductive sheet from which the die-cut gasket of FIGS. 1 to 3 is made, or produced is described below. Thirty-three and one-half (33.5) grams of a conventional Dow Corning silicone gum (resin) eg#440 is mill mixed with 3.76 grams of CAB-O-SIL MS7 silica, 0.29 grams of R.T. Vanderbilt Varox (2,5-dimethyl, 2,5-di(t-butylperoxy)hexane. To this mixture on the mill is added 62 grams of aluminum-tin-silver particles (powder) 20 microns average size and mixing is continued to homogenuity. The mixture is sheeted off the mill 62 mils thick and is placed in a mold and molded at 325° F. at 30 ton pressure for 15 minutes. After removal from the mold, the material is post cured at 300° F. for three hours. The volume percent is 38.5 volume percent particles with the gum (resin) being 58 volume percent. The gasket is then die-cut from the sheet.

EXAMPLE II

An electrically conductive adhesive is prepared by mixing 75 parts by weight of silver-zinc-aluminum powder (20 microns average particle size) as described above in a solution of
20 parts by weight of solid polyamide resin (Versalon 1100)
5 parts by weight of liquid polyamide resin (Versamide 125)
25 parts by weight of toluene
25 parts by weight of ethanol

EXAMPLE III

An electrically conductive caluking is prepared by mixing 288 parts by weight of silver-nickel-aluminum powder (30 microns average particle size) as described above to a solution of
34 parts by weight of toluene
34 parts by weight of ethanol
32 parts by weight of polyamide resin

EXAMPLE IV

The procedure of EXAMPLE I is followed except that silver-zinc-aluminum powder as described above is used

EXAMPLE V

The procedure of EXAMPLE I is followed except that silver-nickel-aluminum as described above is used.

I claim:

1. The method of providing electromagnetic shielding between two surfaces which comprises placing an electromagnetic energy shield between said two surfaces, said electromagnetic energy shield having a volume resistivity to be effective as an electromagnetic energy shield, said shield having dispersed therein electrically conductive irregularly shaped particles, said particles comprising an outer surface of silver on a sensitizing layer of tin which is on an aluminum central core, said tin being present on said aluminum in an amount sufficient to provide a surface to which the silver may be placed thereon, said particles having the ability to withstand 120° C. for 120 hours without exhibiting substantial loss in conductivity.

2. The method of claim 1 in which the silver is plated on the sensitizing tin layer.

3. The method of claim 2 in which the resin is silicone.

4. A method of providing electromagnetic energy shielding between two surfaces which comprises placing a form stable gasket between said two surfaces and clamping said surfaces together to compress the gasket therebetween, said gasket comprising having a volume resistivity to be effective as an electromagnetic energy shield, said material comprising a resin matrix loaded with electrically conductive, irregularly shaped particles, said particles comprising an aluminum core having a first layer of tin and a second layer of silver on said first layer.

5. The method of claim 4 in which said first layer comprises 1 to 10% by weight of said particles and said second layer comprises 10 to 25% by weight of said particles.

6. The method of claim 4 in which said particles comprises 20 to 50% volume percent of the material.

7. The method of claim 4 in which the resin matrix is silicone.

8. The method of providing electromagnetic energy shielding between two surfaces which comprises placing between said two surfaces a material having a volume resistivity to be effective as an electromagnetic energy shield comprising a resin matrix loaded with irregularly shaped particles, said particles comprising an aluminum core, a first layer of zinc on said aluminum and a second layer of silver on said first layer.

9. The material of claim 8 in which the first layer comprises 1 to 10% by weight of the particles and the second layer comprises 10 to 25% by weight of the particles.

10. The material of claim 8 in which the average particle size is 1 to 60 microns and the volume resistivity is less than 0.01 ohm cm.

* * * * *